(12) United States Patent
Lin et al.

(10) Patent No.: US 6,531,333 B2
(45) Date of Patent: Mar. 11, 2003

(54) CHIP PHOTOELECTRIC SENSOR ASSEMBLY AND METHOD FOR MAKING SAME

(76) Inventors: Hong-Ming Lin, No. 31, Alley 2, Lane 221, Kao Tsui Rd., Hsinchu City (TW); Jin-Chuan Bai, 4F, No.5, Alley 6, Lane 394, Chung Chen N. Rd., Sanzhong City, Taipei Hsien (TW)

( * ) Notice: Subject to any disclaimer, the term of this patent is extended or adjusted under 35 U.S.C. 154(b) by 0 days.

(21) Appl. No.: 09/881,757

(22) Filed: Jun. 18, 2001

(65) Prior Publication Data

US 2001/0029059 A1 Oct. 11, 2001

Related U.S. Application Data

(62) Division of application No. 09/543,360, filed on Apr. 5, 2000.

(51) Int. Cl.⁷ .............................................. H01L 21/00
(52) U.S. Cl. ............................ 438/64; 438/65; 438/66; 438/67; 438/116; 257/433; 257/434
(58) Field of Search ................. 438/107, 108, 438/110, 112, 111, 116, 64–72, 73–75, 127, 958; 257/778, 780, 793, 225–234, 433, 434, 435; 250/208.1, 239

(56) References Cited

U.S. PATENT DOCUMENTS

| | | | |
|---|---|---|---|
| 4,827,118 A | 5/1989 | Shibata et al. | |
| 5,266,828 A | * 11/1993 | Nakamura et al. | 257/432 |
| 5,604,362 A | 2/1997 | Jedlika et al. | |
| 5,607,227 A | 3/1997 | Yasumoto et al. | |
| 5,776,796 A | * 7/1998 | Distefano et al. | 438/106 |
| 5,861,680 A | 1/1999 | Yamanaka | |
| 6,143,588 A | 11/2000 | Glenn | |
| 6,150,716 A | * 11/2000 | MacQuarrie et al. | 257/709 |
| 6,316,285 B1 | * 11/2001 | Jiang et al. | 438/106 |
| 6,352,879 B1 | * 3/2002 | Fukui et al. | 438/106 |
| 6,399,418 B1 | * 6/2002 | Glenn et al. | 438/106 |
| 6,407,381 B1 | * 6/2002 | Glenn et al. | 250/239 |
| 6,415,505 B1 | * 7/2002 | Glenn | 29/852 |

\* cited by examiner

Primary Examiner—Amir Zarabian
Assistant Examiner—Christy Novacek
(74) Attorney, Agent, or Firm—Browdy and Neimark, P.L.L.C.

(57) ABSTRACT

A chip photoelectric sensor assembly includes a substrate with a printed circuit board mounted thereon. A photoelectric sensor chip is provided with a plurality of photoelectric sensors and is mounted on the substrate such that the photoelectric sensor chip is electrically connected with the substrate. The photoelectric sensors of the photoelectric sensor chip are masked by a photosensitive protective layer made of a photosensitive hard coating material. The photosensitive protective layer has a thickness ranging between 1 and 10 microns. The very thin photosensitive protective layer is thus capable of minimizing the light refraction distortion.

6 Claims, 3 Drawing Sheets

CHIP PHOTOELECTRIC SENSOR ASSEMBLY AND METHOD FOR MAKING SAME

This is a division of copending parent application Ser. No. 09/543,360, filed Apr. 5, 2000.

FIELD OF THE INVENTION

The present invention relates to a chip photoelectric sensor assembly and a method for making the chip photoelectric sensor assembly.

BACKGROUND OF THE INVENTION

As shown in FIG. 1, a chip photoelectric sensor assembly of the prior art has a photoelectric sensor chip 10 which is attached to a substrate 12 such that the chip 10 is electrically connected with the substrate 12 by a plurality of leads 14. The chip 10 is provided on the top thereof with a protective layer 16 which is made of a transparent resin material by molding.

Such a prior art chip photoelectric sensor as described above is defective in design in that the protective layer 16 is excessively thick and is apt to cause the refraction of light passing through the protective layer 16. Generally speaking, the optimal thickness of the protective layer 16 is about 50 microns.

As shown in FIG. 2, another prior art chip photoelectric sensor has a photoelectric sensor chip 21 which is provided on the top thereof with a protective layer 20, and in the underside thereof with a plurality of electrodes 22, with each having a projection 23 conductive to electricity. The chip 21 is further provided with a photoelectric sensor 24 and a transparent insulation layer 25 made of a resin material. The transparent insulation layer 25 is intended for use in mounting the chip 21 on an electrically-conductive layer 27 which is mounted on a glass substrate 26. This prior art chip photoelectric sensor assembly is susceptible to distortion which is brought about by the refraction of light passing through the glass substrate 26 and the transparent insulation layer 25.

SUMMARY OF THE INVENTION

The primary objective of the present invention is to provide a method for making a chip photoelectric sensor assembly which is free from the drawbacks of the prior art chip photoelectric sensor assemblies described above.

In keeping with the principle of the present invention, the foregoing objective of the present invention is attained by a chip photoelectric sensor assembly comprising a substrate, a printed circuit board mounted on the top of the substrate, a photoelectric sensor chip disposed on the top of the printed circuit board and provided on the top thereof with a photosensitive area which is formed by a plurality of photosensors, and a plurality of electric connection ports. The electric connection: ports are connected with the printed circuit board. The electrically-connected portion of the photoelectric sensor chip and the substrate is protected by an insulation layer. The photosensitive area of the photoelectric sensor chip is provided with a transparent protective layer of a hard coating material. In light of the transparent protective layer being very thin, the light refraction is averted.

The chip photoelectric sensor assembly is coated with a transparent layer of the hard coating material. A rigid transparent protective layer is formed only in the photosensitive area of the photoelectric sensor chip by the photolithographic process.

DETAILED DESCRIPTION OF THE INVENTION

Figure 1:
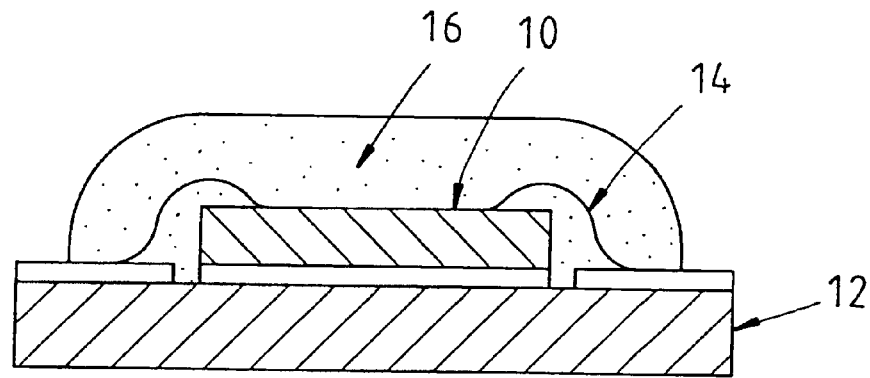
FIG. 1 shows a sectional schematic view of a chip photoelectric sensor assembly of the prior art.
Figure 2:
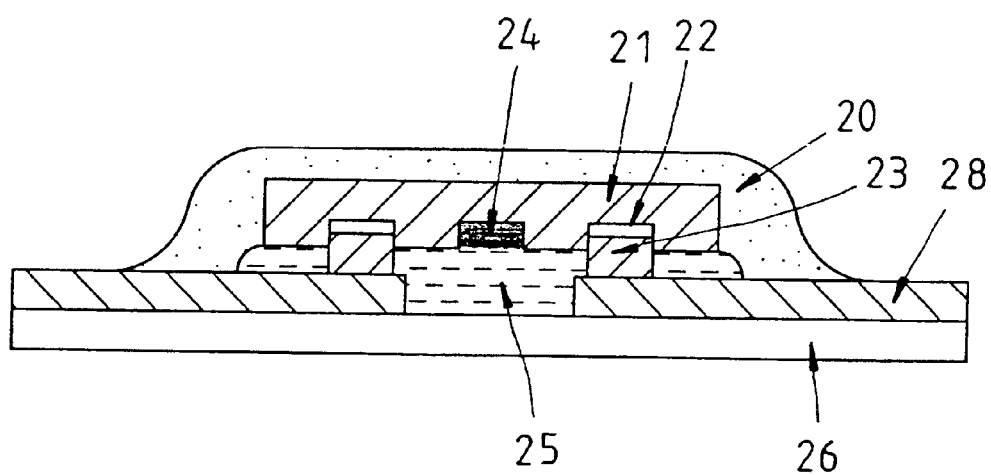
FIG. 2 shows a sectional schematic view of another chip photoelectric sensor assembly of the prior art.
Figure 3:
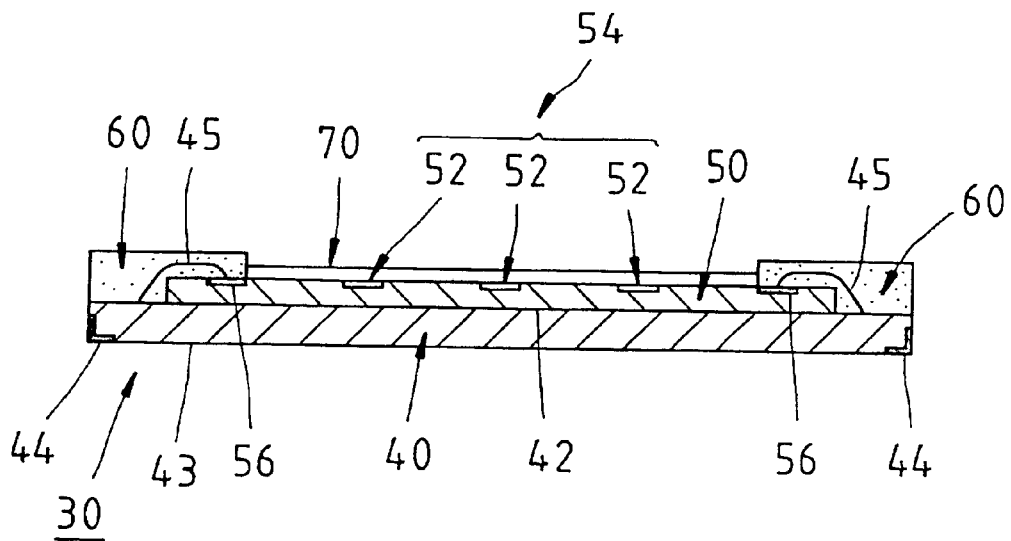
FIG. 3 shows a sectional schematic view of a chip photoelectric sensor assembly of a first preferred embodiment of the present invention.

As shown in FIG. 3, a chip photoelectric sensor assembly 30 embodied in the present invention comprises a substrate 40, a photoelectric sensor chip 50, two protective covers 60, and a light-permeable protective layer 70.

The substrate 40 is provided on an upper surface 42 thereof with a printed circuit board mounted thereon, and in an underside 43 thereof with two soldering pads 44 opposite to each other. The substrate 40 is further provided in proximity of two lateral sides of the upper surface 42 thereof with a plurality of bonding wires 45.

The photoelectric sensor chip 50 is provided in the center of the upper surface thereof with a plurality of photoelectric sensors 52 and a photosensitive area 54 formed by the photoelectric sensors 52. The photoelectric sensor chip 50 is further provided in two lateral sides of the upper surface thereof with a plurality of electric connection ports 56. The photoelectric sensor chip 50 is mounted on the substrate 40 such that the electric connection ports 56 are connected with the bonding wires 45 of the substrate 40. As a result, the photoelectric sensor chip 50 is electrically connected with the substrate 40. The photoelectric sensor 52 may be a photoelectric transistor, light-emitting diode, CCD, or CMOS.

The two protective covers 60 are made of an electrically-insulating resin and are evenly distributed on the two lateral sides of the photoelectric sensor chip 50, the bonding wires 45 of the substrate 40, and the connection ends of the substrate 40.

The light-permeable protective layer 70 covers the photosensitive area 54 of the photoelectric sensor chip 50 and has a thickness of 1 micron or so. In light of the minute thickness of the protective layer 70, the distortion of the light refraction is minimized.

The chip photoelectric sensor assembly 30 of the present invention is made by a method which is described hereinafter with reference to FIG. 4.

Figure 4:
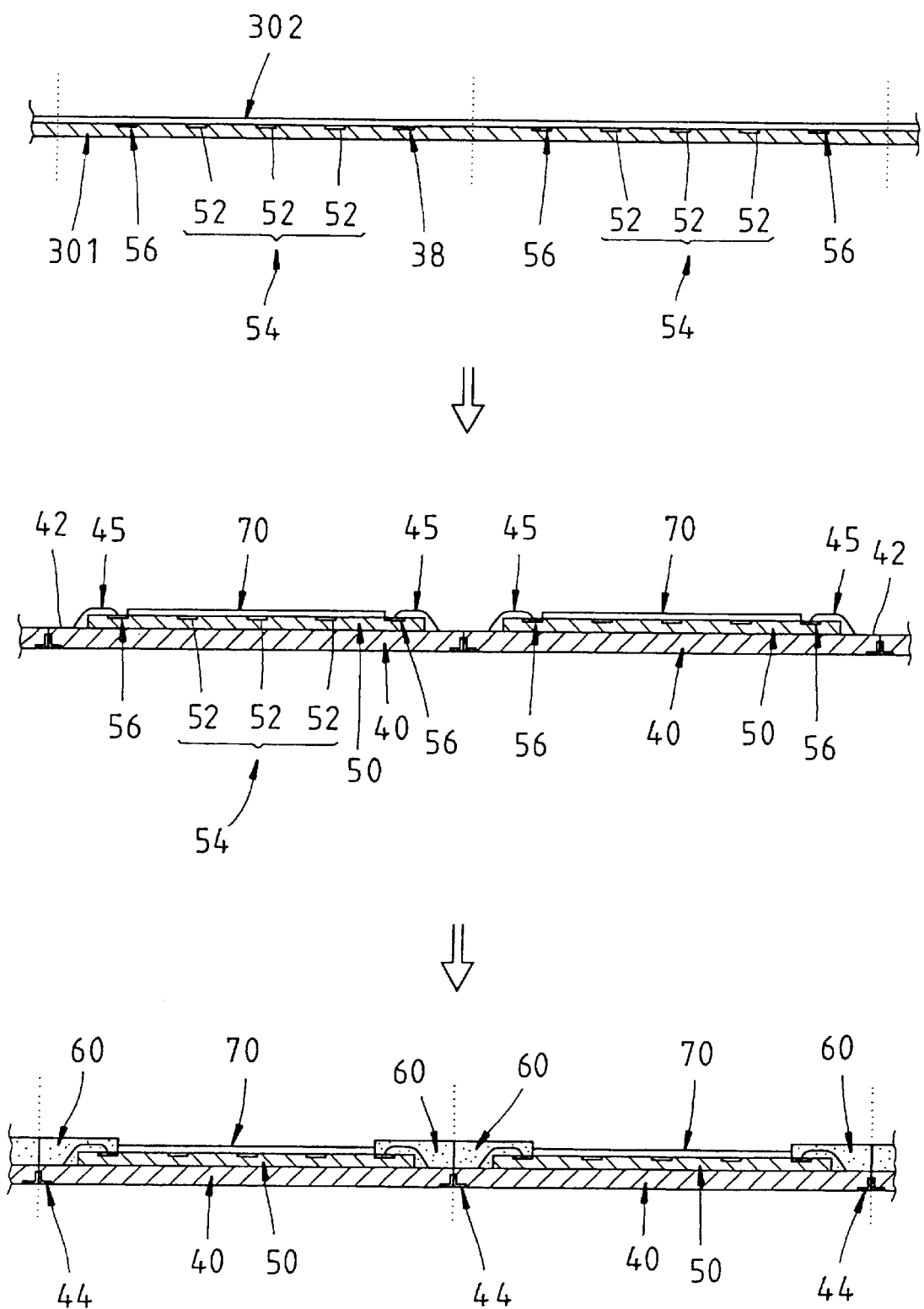
FIG. 4 shows a process flow of making the chip photoelectric sensor assembly of the present invention.

As illustrated in FIG. 4, the first step of the method of the present invention involves the production of a wafer 301 by a semiconductor process. The wafer 301 is provided thereon with a plurality of photoelectric sensors 52 and electric connection ports 56. The wafer 301 is subsequently provided with a coating 302 on one side of the position on which the photoelectric sensors 52 are disposed. The coating 302 is made of a highly transparent photosensitive hard coating material, such as "PCC-100" coating material produced by Goo Chemicals Corp. of Japan. The light-permeable protective layer 70 is then formed of the coating 302 by a photolithographic process such that the very thin protective layer 70 is formed only on the photosensitive area 54. The protective layer 70 has a thickness ranging between 1 and 10 microns.

Figure 5:
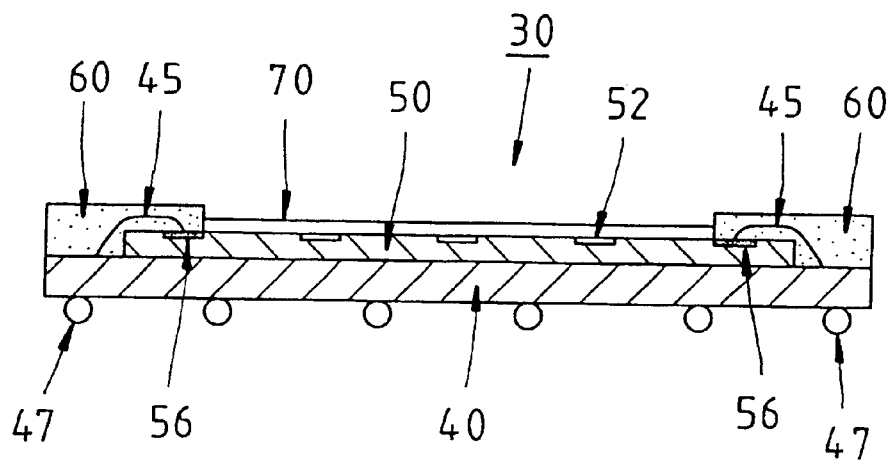
FIG. 5 shows a sectional schematic view of a chip photoelectric sensor assembly of a second preferred embodiment of the present invention.

The wafer 301 is divided by the conventional wafer cutting method into a plurality of photoelectric sensor chips 50. Each chip 50 is attached by die bond to the substrate 40 such that the other side (without the photoelectric sensors) of the chip 50 is disposed on the upper surface 42 of the substrate 40, on which a printed circuit board is mounted. By using the conventional wiring method, the chip 50 is electrically connected with the printed circuit board by the electric connection ports 56 which are connected with the bonding wires 45. Finally, the electric connection ports 56 and the bonding wires 45 are protected by the insulation covers 60. The underside 43 of the substrate 40 is provided with a plurality of spherical soldering pads 47, as shown in FIG. 5, or striplike soldering pads 44, as shown in FIGS. 3 and 4. The soldering pads are mounting by the conventional electrode ball mounting or electrode pre-soldering.

It must be noted here that the coating 302 is evenly distributed on the wafer 301 by a process in which the coated wafer is spinned.

What is claimed is:

1. A method for making a chip photoelectric sensor assembly comprising: a substrate provided on an upper surface thereof with a printed circuit board mounted thereon, and a plurality of bonding wires, said substrate further provided in an underside thereof with a plurality of soldering pads; a photoelectric sensor chip provided in the center of an upper surface thereof with a plurality of photoelectric sensors and a photosensitive area formed by said photoelectric sensors, said photoelectric sensor chip further provided on the upper surface thereof with a plurality of electric connection ports whereby said photoelectric sensor chip is mounted on said substrate such that said electric connection ports of said photoelectric sensor chip are connected with said bonding wires of said substrate; a protective cover made of an electrically-insulating resin and shielding said electric connection ports and said bonding wires; and a light-permeable protective layer masking said photosensitive area of said photoelectric sensor chip whereby said light-permeable protective layer has a thickness ranging between 1 and 10 microns; said method comprising:

(a) making or providing a semiconductor wafer;
    (b) providing the wafer with a plurality of photoelectric sensors and electric connection ports;
    (c) coating evenly the wafer with a covering of a photosensitive hard coating material such that the photoelectric sensors and the electric connection ports are covered by the coating;
    (d) forming a light-permeable protective layer of the photosensitive hard coating material by a photolithographic process such that only the photoelectric sensors are masked by the light-permeable protective layer;
    (e) dividing the wafer into a plurality of photoelectric sensor chips;
    (f) mounting respectively the photoelectric sensor chips on a substrate with a printed circuit board mounted on the upper surface thereof whereby said substrate is provided on the upper surface thereof with a plurality of bonding wires and in the underside thereof with a plurality of soldering pads;
    (g) connecting electrically the photoelectric sensor chip with the substrate by connecting the electric connection ports with the bonding wires; and
    (h) providing each photoelectric sensor chip with a protective cover of an electrically-insulating resin whereby said protective cover shields the electric connection ports and the bonding wires.

2. The method as defined in claim 1, wherein the photosensitive hard coating material is evenly coated on the wafer in step (c) by spinning the coated wafer.

3. The method of claim 1 wherein said forming a light-permeable protective layer produces said light-permeable protective layer in a thickness of about 1–10$\mu$.

4. The method of claim 2 wherein said forming a light-permeable protective layer produces said light-permeable protective layer in a thickness of about 1–10$\mu$.

5. The method of claim 1 wherein said forming a light-permeable protective layer produces said light-permeable protective layer in a thickness of about 1$\mu$.

6. A method for making a chip photoelectric sensor assembly comprising: a substrate provided on an upper surface thereof with a printed circuit board mounted thereon, and a plurality of bonding wires, said substrate further provided in an underside thereof with a plurality of soldering pads; a photoelectric sensor chip provided in the center of an upper surface thereof with a plurality of photoelectric sensors and a photosensitive area formed by said photoelectric sensors, said photoelectric sensor chip further provided on the upper surface thereof with a plurality of electric connection ports whereby said photoelectric sensor chip is mounted on said substrate such that said electric connection ports of said photoelectric sensor chip are connected with said bonding wires of said substrate; a pair of protective covers made of an electrically-insulating resin and shielding said electric connection ports and said bonding wires; and a light-permeable protective layer masking said photosensitive area of said photoelectric sensor chip whereby said light-permeable protective layer has a thickness ranging between 1 and 10 microns; said method comprising:

(a) making or providing a semiconductor wafer;
    (b) providing the wafer with a plurality of photoelectric sensors and electric connection ports;
    (c) coating evenly the wafer with a covering of a photosensitive hard coating material such that the photoelectric sensors and the electric connection ports are covered by the coating;
    (d) forming a light-permeable protective layer of the photosensitive hard coating material by a photolithographic process in a thickness of 1–10$\mu$ such that only the photoelectric sensors are masked by the light-permeable protective layer;
    (e) dividing the wafer into a plurality of photoelectric sensor chips;
    (f) mounting respectively the photoelectric sensor chips on a substrate with a printed circuit board mounted on the upper surface thereof whereby said substrate is provided on the upper surface thereof with a plurality of bonding wires and in the underside thereof with a plurality of soldering pads;
    (g) connecting electrically the photoelectric sensor chip with the substrate by connecting the electric connection ports with the bonding wires; and
    (h) providing each photoelectric sensor chip with a pair of protective covers of an electrically-insulating resin along sides of said sensor chip, whereby said protective covers shield the electric connection ports and the bonding wires.

* * * * *